United States Patent [19]
King

[11] Patent Number: 6,027,761
[45] Date of Patent: Feb. 22, 2000

[54] MANUFACTURING PROCESS AND STRUCTURE OF CAPACITOR

[75] Inventor: Wei-Shang King, Hsinchu, Taiwan

[73] Assignee: Mosel Vitelic Inc., Hsinchu, Taiwan

[21] Appl. No.: 09/172,747

[22] Filed: Oct. 14, 1998

[30] Foreign Application Priority Data

Mar. 6, 1998 [TW] Taiwan ................................. 87103321

[51] Int. Cl.⁷ ..................................................... B05D 5/12
[52] U.S. Cl. .......................... 427/79; 29/25.41; 29/25.42; 438/254; 438/397
[58] Field of Search ................................ 427/79, 80, 81; 29/25.03, 25.41, 25.42; 438/253, 254, 396, 397, 239, 381

[56] References Cited

U.S. PATENT DOCUMENTS

| | | | |
|---|---|---|---|
| 5,137,842 | 8/1992 | Chan et al. | 437/48 |
| 5,721,168 | 2/1998 | Wu | 438/253 |
| 5,763,304 | 6/1998 | Tseng | 438/239 |
| 5,888,863 | 3/1999 | Tseng | 438/253 |

*Primary Examiner*—Brian K. Talbot
*Attorney, Agent, or Firm*—Skjerven Morrill MacPherson Franklin & Friel LLP; Barmak S. Sani

[57] ABSTRACT

A method for manufacturing a capacitor, applied to a memory unit having a substrate forming thereon a dielectric layer, includes the steps of a) forming a sacrificial layer over the dielectric layer, b) partially removing the sacrificial layer and the dielectric layer to form a contact window, c) forming a first conducting layer over the sacrificial layer and in the contact window, d) partially removing the first conducting layer and the sacrificial layer to expose a portion of the sacrificial layer and retain a portion of the first conducting layer, e) forming a second conducting layer alongside the portion of the first conducting layer and the portion of the sacrificial layer, f) removing the portion of the sacrificial layer to expose the dielectric layer, g) forming a third conducting layer over surfaces of the portion of the first conducting layer, the second conducting layer, and the dielectric layer, and h) partially removing the third conducting layer while retaining a portion of the third conducting layer under the portion of the first conducting layer and the second conducting layer and on the dielectric layer. The fabricated capacitor has a generally crosssectionally modified T-shaped structure which not only effectively increases the surface area of the capacitor but only has a smooth top surface which is conducive to the subsequent planarization process.

19 Claims, 9 Drawing Sheets

6,027,761

MANUFACTURING PROCESS AND STRUCTURE OF CAPACITOR

FIELD OF THE INVENTION

The present invention is related to a structure and a manufacturing method of a capacitor, and especially to a structure and a manufacturing method of a capacitor applied to the dynamic random access memory (DRAM).

BACKGROUND OF THE INVENTION

It is well known that the capacity of a capacitor is related to the quality of dynamic random access memory (DRAM). Therefore, many methods have been developed for increasing the capacity of capacitor.

First of all, please refer to FIGS. 1(a) and (b) showing a conventional method for manufacturing a capacitor. This method is detailedly described as follows.

Shown in FIG. 1(a) includes the steps of (1) forming an interlayer dielectric (ILD) 11 over a silicon substrate 10 by chemical vapor deposition (CVD) or lower pressure chemical vapor deposition (LPCVD), (2) defining a contact window by photolithography and partially removing the ILD 11 to form the contact window 12, (3) forming a doped polysilicon layer 13 with a thickness of 1000 Å over the ILD 11 and in the contact window 12 by LPCVD, and (4) forming a rugged polysilicon layer 14 with a thickness of 850 Å over the doped polysilicon layer 13 to increase the surface area of the capacitor.

In FIG. 1(b), the steps include: 1) defining the capacitor region by photolithography and partially etching the rugged polysilicon layer 14 and the doped polysilicon layer 13 to expose a portion of the ILD 11; 2) forming an oxide-on-nitride-on-oxide (ONO) layer 15 on the rugged polysilicon layer 14 and the ILD 11 and alongside the doped polysilicon layer 13 by LPCVD; and 3) forming another doped polysilicon layer 16 over the ONO layer 15 to construct the conventional capacitor.

Please refer to FIG. 2 showing another conventional method. The detailed steps are illustrated as follows.

In FIG. 2(a), the steps include: (1) forming an interlayer dielectric (ILD) 21 over a silicon substrate 20 by chemical vapor deposition (CVD), (2) forming a silicon nitride 22 on ILD 21, wherein the silicon nitride 22 has a thickness of 100 Å~300 Å and serves as an etching stop layer, (3) forming a sacrificial oxide 23 on the silicon nitride 22 by CVD, (4) defining a contact window by photolithography and partially removing the ILD 21, the silicon nitride 22, and the sacrificial oxide 23 to form the contact window 24, and (5) forming a doped polysilicon layer 25 with a thickness of 1000 Å over the sacrificial oxide 23 and in the contact window 24 by LPCVD.

In FIG. 2(b), the steps include: 1) defining the capacitor region by photolithography and partially etching the doped polysilicon layer 25; 2) etching the sacrificial oxide 23 by using a buffer over etching (B.O.E.) solution containing hydrofluoric acid (HF) to expose the silicon nitride 22; 3) forming an oxide-on-nitride-on-oxide (ONO) layer 26 on the silicon nitride 22 and a top and sidewalls of the doped polysilicon layer 25 by LPCVD; and 4) forming another doped polysilicon layer 27 on the ONO layer 26 to construct the capacitor.

In addition, there is another method as shown in FIG. 3. This method is described as follows.

In FIG. 3(a), the steps include: (1) forming an interlayer dielectric (ILD) 31 over a silicon substrate 30 by CVD, (2) forming a silicon nitride 32 on ILD 31, wherein the silicon nitride 32 has a thickness of 100 Å~300 Å and serves as an etching stop layer, (3) forming a first sacrificial oxide 33 on the silicon nitride 32 by CVD, (4) defining a contact window by photolithography and partially removing the first sacrificial oxide 33, the silicon nitride 32, and the ILD 31 to form the contact window 34, (5) forming a first doped polysilicon layer 35 with a thickness of 1000 Å over the first sacrificial oxide 33 and in the contact window 34 by LPCVD, and (6) forming a second sacrificial oxide 36 on the first doped polysilicon layer 35 by CVD.

In FIG. 3(b), the steps include: 1) defining the capacitor region by photolithography and partially etching the second sacrificial oxide 36, the first doped polysilicon layer 35, and the first sacrificial oxide 33, wherein the silicon nitride 32 serves as an etching stop layer; and 2) forming a second doped polysilicon layer 37 on the top surface of the second sacrificial oxide 36, alongside the second sacrificial oxide 36, the first doped polysilicon layer 35, and the first sacrificial oxide 33, as well as on the silicon nitride 32.

In FIG. 3(c), the second doped polysilicon layer 37 is etched by dry etching (i.e. an anisotropic etching) to expose the top surface of the second sacrificial oxide 36 and a portion of the silicon nitride 32.

In FIG. 3(d), the second sacrificial oxide 36 is completely removed by using a buffer over etching (B.O.E.) solution containing hydrofluoric acid (HF) to expose the first doped polysilicon layer 35. Thereafter, an oxide-on-nitride-on-oxide (ONO) layer 38 is formed over the portion of the silicon nitride 32, the second doped polysilicon layer 37, and, the first doped polysilicon layer 35 by LPCVD. Finally, another doped polysilicon layer 39 is formed on the ONO layer 38 to construct the capacitor.

However, these conventional methods have some drawbacks described as follows:

1. In FIGS. 1(a) and (b), the rugged polysilicon layer in the fixed capacitor region can not effectively increase the surface area of the capacitor. Therefore, the maximum capacity can be only increased up to two times by such a method using the rugged polysilicon layer for increasing the surface area of capacitor. Because the size of the capacitor will be getting smaller in the future, this method may be no longer effective then.
2. In the method of FIGS. 2(a) and (b), the sacrificial oxide is formed and then is etched for increasing the surface area of the capacitor, but the effect is not good enough.
3. In the method as shown in FIGS. 3(a)~(d), the cylindrical doped polysilicon can increase the surface area of the capacitor which is constructed by a doped polysilicon layer, the ONO layer, and another doped polysilicon layer. However, it can be seen from FIG. 3(d) that the surface of the capacitor is so irregular that it will seriously influence the subsequent planarization process of the semiconductor.

Therefore, the present invention is developed to improve the above-described disadvantages.

SUMMARY OF THE INVENTION

An object of the present invention is to provide a manufacturing method which can effectively increase the density and intensity of the capacitor applied to the memory unit with high density.

Another object of the present invention is to provide a structure and a manufacturing method for promoting the yield rate of a capacitor.

According to the present invention, the method for manufacturing a capacitor, applied to a memory unit having a substrate forming thereon a dielectric layer, includes the steps of a) forming a sacrificial layer over the dielectric layer, b) partially removing the sacrificial layer and the dielectric layer to form a contact window, c) forming a first conducting layer over the sacrificial layer and in the contact window, d) partially removing the first conducting layer and the sacrificial layer to expose a portion of the sacrificial layer and retain a portion of the first conducting layer, e) forming a second conducting layer alongside the portion of the first conducting layer and the portion of the sacrificial layer, f) removing the portion of the sacrificial layer to expose the dielectric layer, g) forming a third conducting layer over surfaces of the portion of the first conducting layer, the second conducting layer, and the dielectric layer, and h) partially removing the third conducting layer while retaining a portion of the third conducting layer under the portion of the first conducting layer and the second conducting layer and on the dielectric layer, wherein the portion of the first conducting layer, the second conducting layer, and the portion of the third conducting layer serve as a capacitor plate.

Preferably, the dielectric layer is formed by a chemical vapor deposition (CVD). The dielectric layer is preferably a nondoped silicon glass (NSG) layer with a thickness ranged between 1000 Å and 3000 Å.

In the step (a), the sacrificial layer is formed by a chemical vapor deposition. The sacrificial layer is a silicon dioxide layer with a thickness more than 6000 Å.

In the step (b), the contact window is formed by a photolithography and an etching technique.

In the step (c), the first conducting layer is formed by a chemical vapor deposition. The first conducting layer is preferably a doped polysilicon layer with a thickness ranged between 1000 Å and 3000 Å.

In the step (d), the first conducting layer and the sacrificial layer are partially removed by a photolithography and an etching technique.

The step (e) further includes: e1) forming the second conducting layer over the portion of the first conducting layer and the portion of the sacrificial layer; and e2) executing an anisotropic etching process to partially remove the second conducting layer while retaining the second conducting layer alongside the portion of the first conducting layer and the portion of the sacrificial layer. The second conducting layer is a doped polysilicon layer with a thickness ranged between 1000 Å and 3000 Å and is formed by a chemical vapor deposition.

In the step (f), the portion of the sacrificial layer is removed by a wet etching using a buffer over etching (B.O.E.) solution containing hydrofluoric acid (HF).

In the step (g), the third conducting layer is preferably a doped polysilicon layer formed by a chemical vapor deposition.

After the step (h), this method further includes the steps of: i) forming an another dielectric layer over surfaces of the portions of the first, second, and third conducting layers and the exposed dielectric layer; and j) forming a fourth conducting layer over the another dielectric layer to serve as an another capacitor plate.

The another dielectric layer and the fourth conducting layer are formed by a chemical vapor deposition (CVD). The another dielectric layer is an oxide-on-nitride-on-oxide (ONO) layer with a thickness ranged between 50 Å and 200 Å. The fourth conducting layer is a doped polysilicon layer.

Preferably, before the step (a), the method further includes a step to form an etching stop layer on the dielectric layer to prevent the dielectric layer from being damaged.

Another object of the present invention is to provide a capacitor applied to a memory unit including a substrate forming thereon a dielectric layer. The capacitor includes a structure formed in the dielectric layer and forming a contact window, a first conducting layer filling in the contact window and upwardly extended to form a generally crosssectionally modified T-shaped structure having a horizontal part and a vertical part where the horizontal part has an end thereof extended and the space between the horizontal part and the dielectric layer is adapted to be occupied by a dielectric layer and a conducting layer, and a second conducting layer formed over a surface under the first conducting layer and on the dielectric layer to construct a capacitor plate.

The capacitor further includes an another dielectric layer formed over surfaces of the first and second conducting layers and on the dielectric layer, and an another conducting layer formed over the another dielectric layer to serve as an another capacitor plate.

The present invention may best be understood through the following description with reference to the accompanying drawings, in which:

DETAILED DESCRIPTION OF THE PREFERRED EMBODIMENT

The preferred embodiment of the method for manufacturing a capacitor according to the present invention is shown in FIGS. 4(a)~(i). The details are described as follows.

Figure 1A:
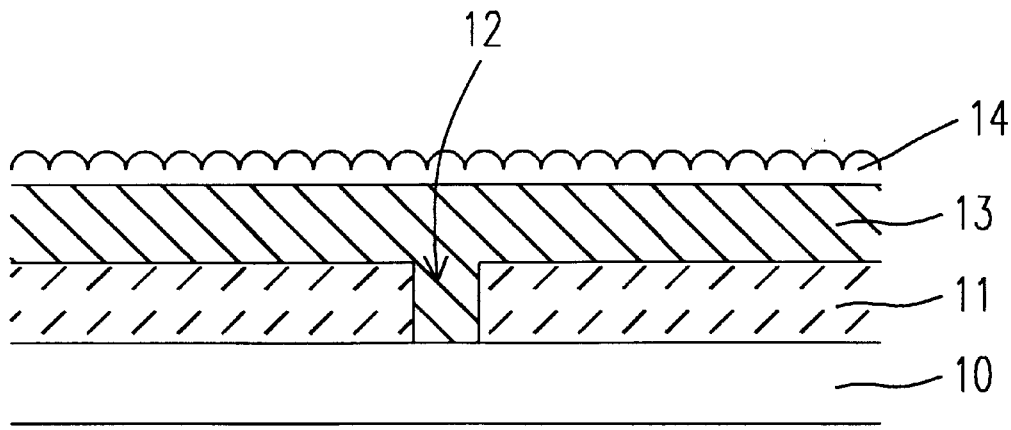
FIGS. 1(a) and (b) are schematic diagrams showing the first method for manufacturing a capacitor according to the prior art.
Figure 1B:
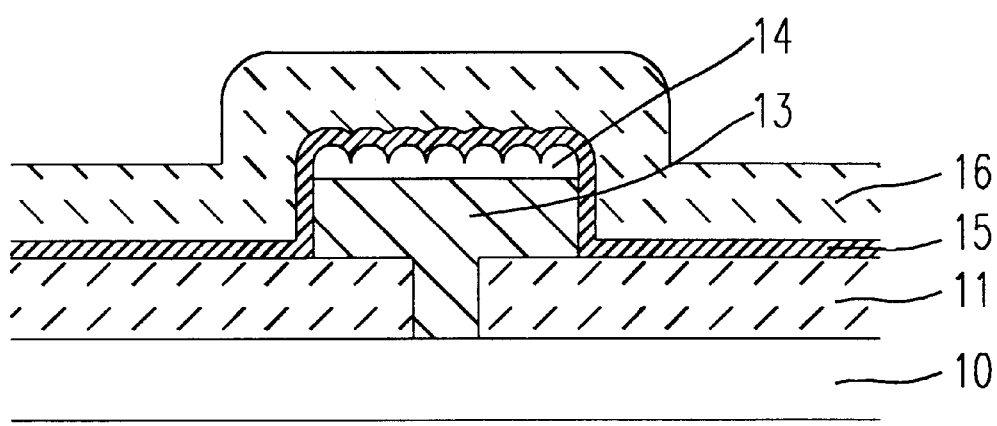
Figure 2A:
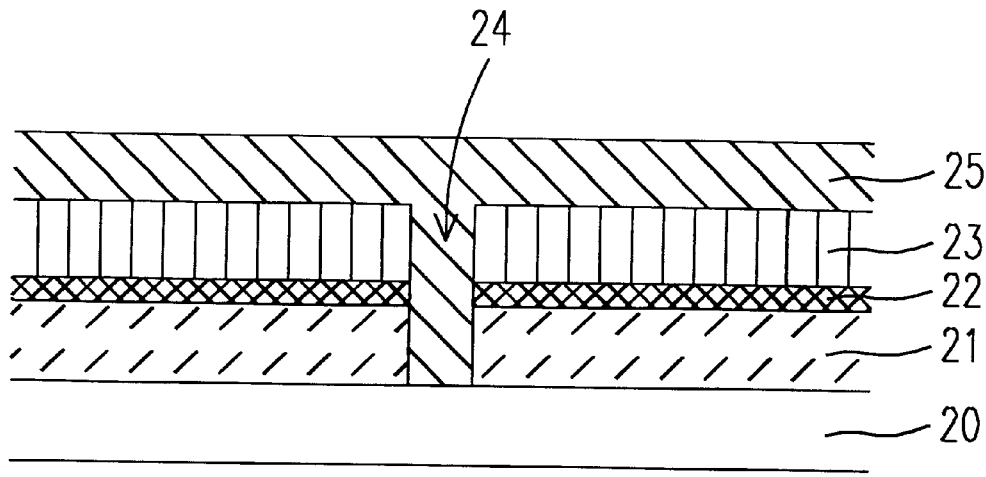
FIGS. 2(a) and (b) are schematic diagrams showing the second method for manufacturing a capacitor according to the prior art.
Figure 2B:
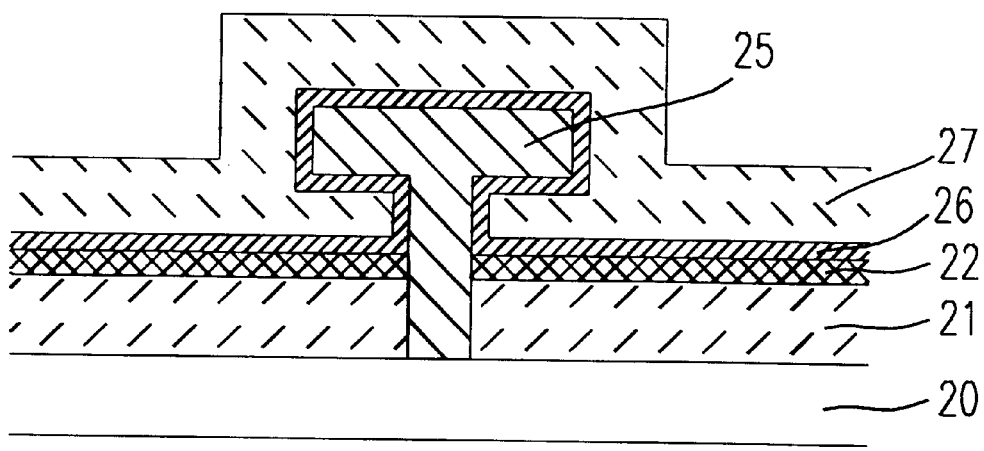
Figure 3A:
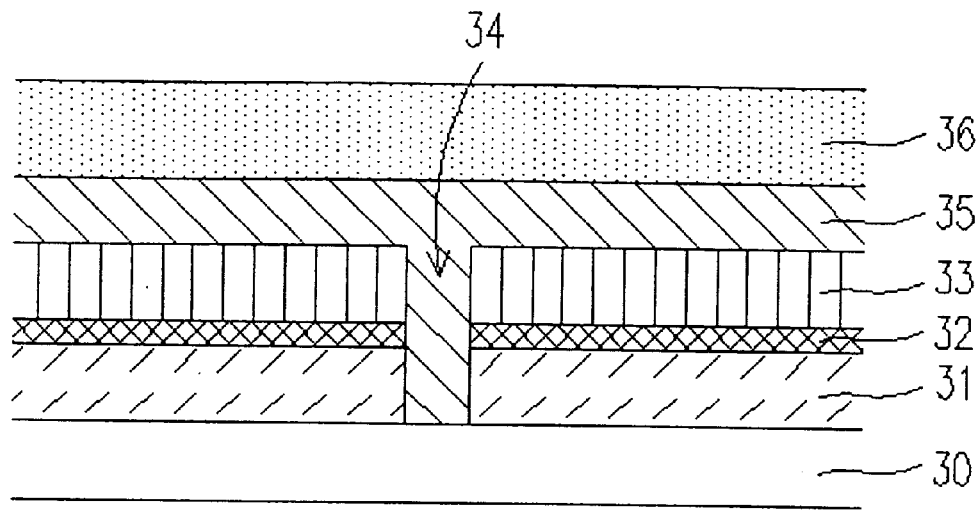
FIGS. 3(a)~(d) are schematic diagrams showing the third method for manufacturing a capacitor according to the prior art.
Figure 3B:
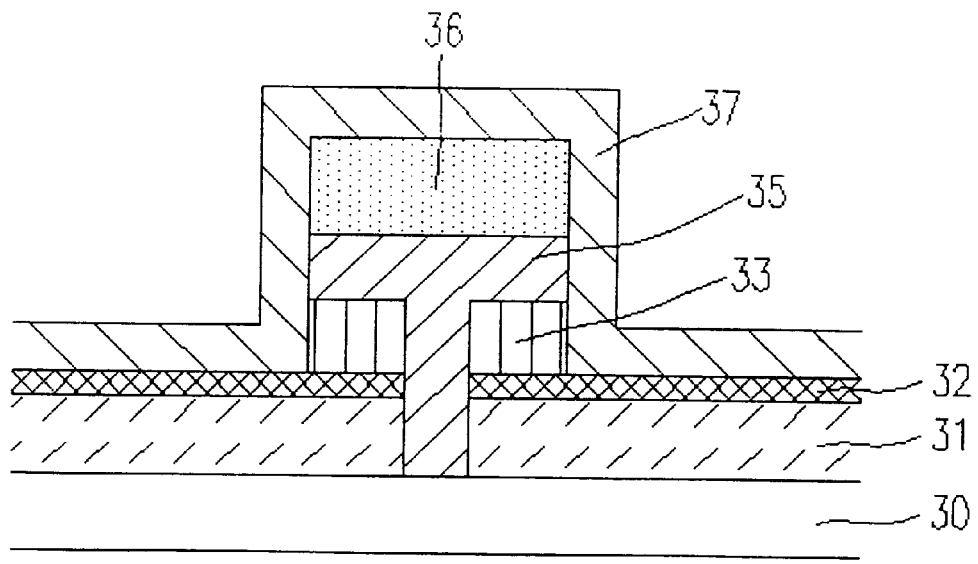
Figure 3C:
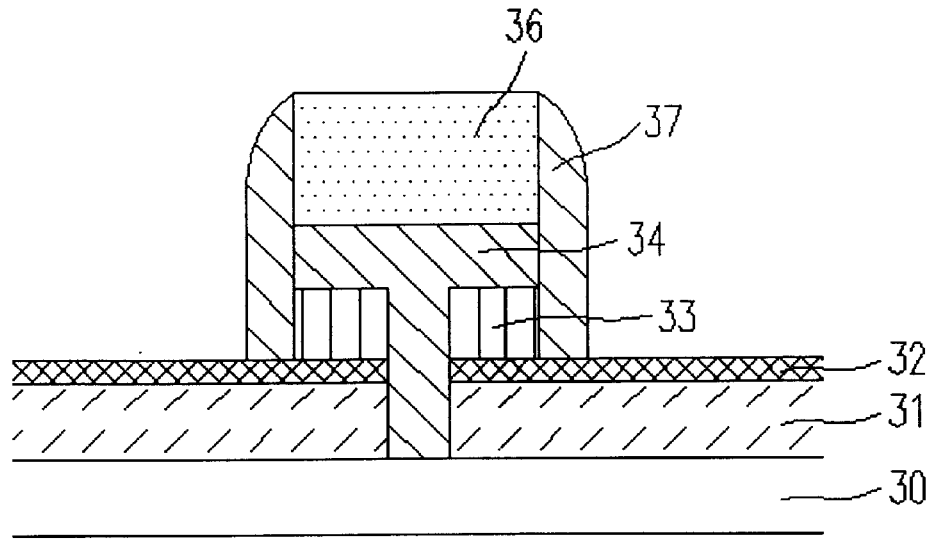
Figure 3D:
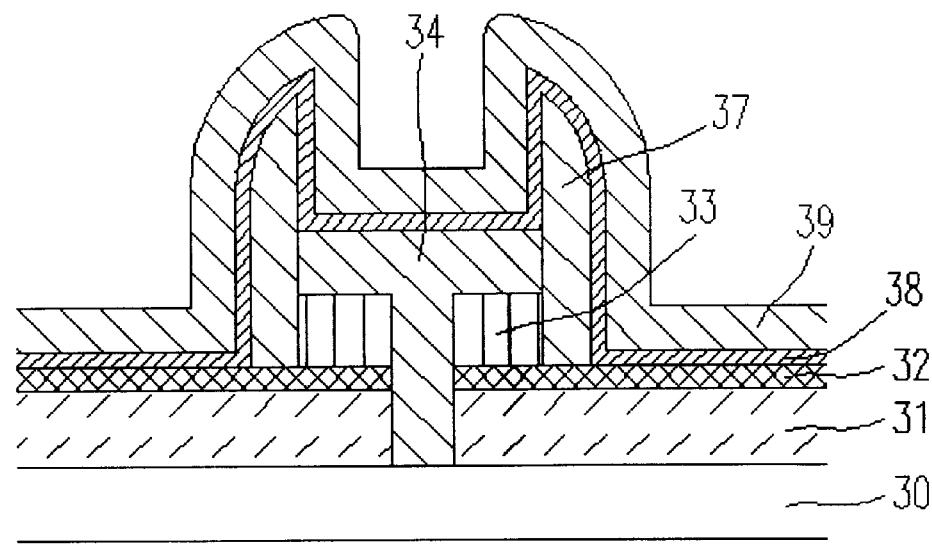
Figure 4A:
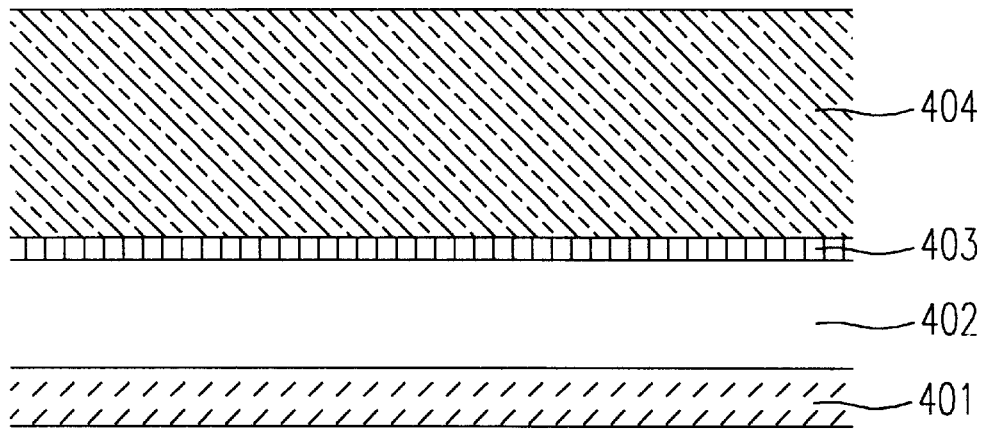
FIGS. 4(a)~(i) are schematic diagrams showing a preferred embodiment of a method for manufacturing a capacitor according to the present invention.

In FIG. 4(a), an interlayer dielectric (ILD) 402 is formed over a substrate 401 by plasma enhanced chemical vapor deposition (PECVD) or lower pressure chemical vapor deposition (LPCVD). The ILD 402 can be a nondoped silicon glass (NSG) layer 402 with a thickness ranged between 1000 Å and 3000 Å. Thereafter, an etching stop layer 403 is formed on the ILD 402 by chemical vapor deposition to prevent the ILD 402 from being damaged during the subsequent etching process. Preferably, the etching stop layer 403 is a silicon nitride 403 with a thickness ranged between 100 Å and 300 Å. A sacrificial layer 404 is then formed on the etching stop layer 403 by chemical vapor deposition. Preferably, the sacrificial layer 404 is a sacrificial oxide having a thickness more than 6000 Å, preferably 8000 Å.

Figure 4B:
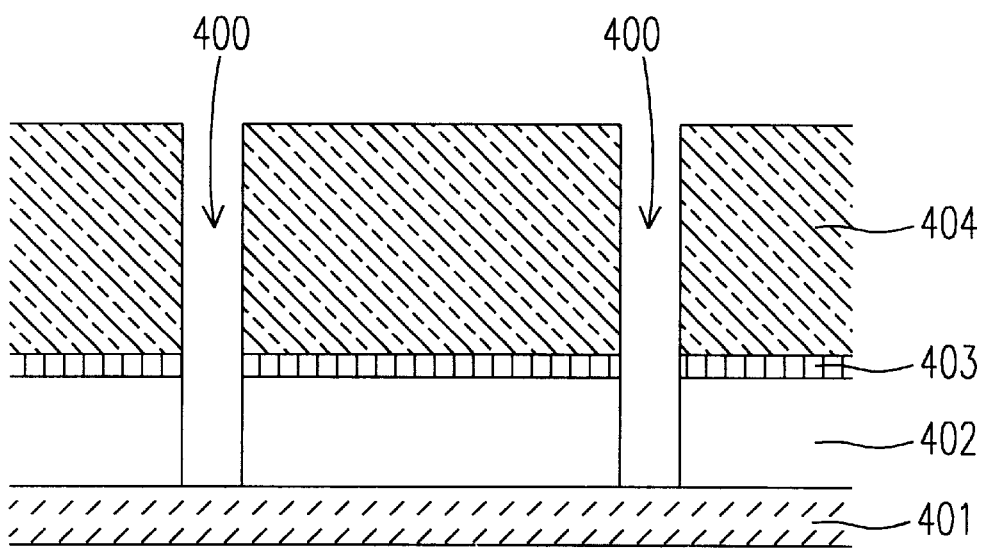
Figure 4C:
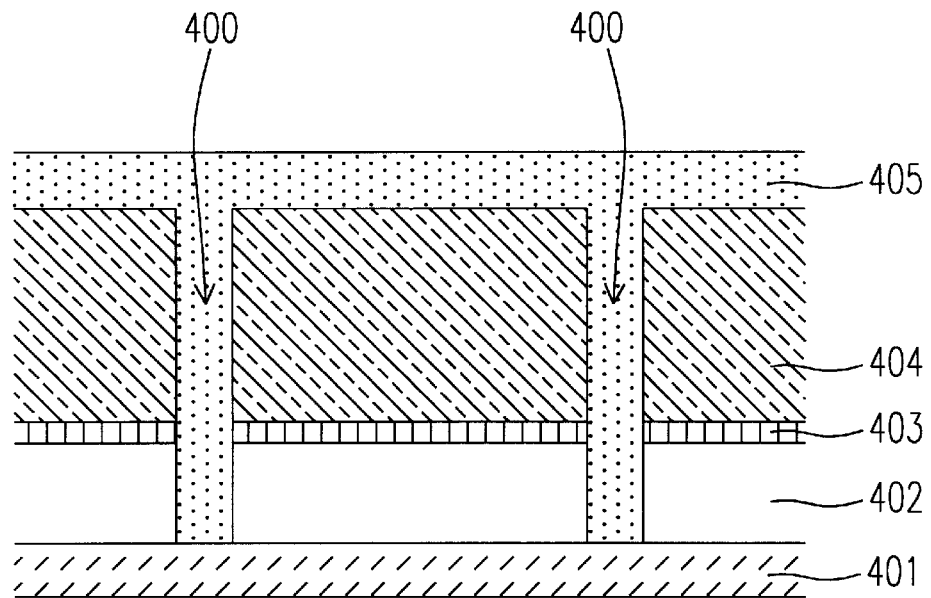

As shown in FIG. 4(b), the sacrificial oxide 404, the etching stop layer 403, and the ILD 402 are partially removed to form a contact window 400 by photolithography and an etching process. Thereafter, a first conducting layer 405 is formed over the sacrificial layer 404 which fills in the contact window 400 by low pressure chemical vapor deposition as shown in FIG. 4(c). Preferably, the first conducting layer 405 is a doped polysilicon layer with a thickness ranged between 1000 Å and 3000 Å, preferably 2000 Å.

Figure 4D:
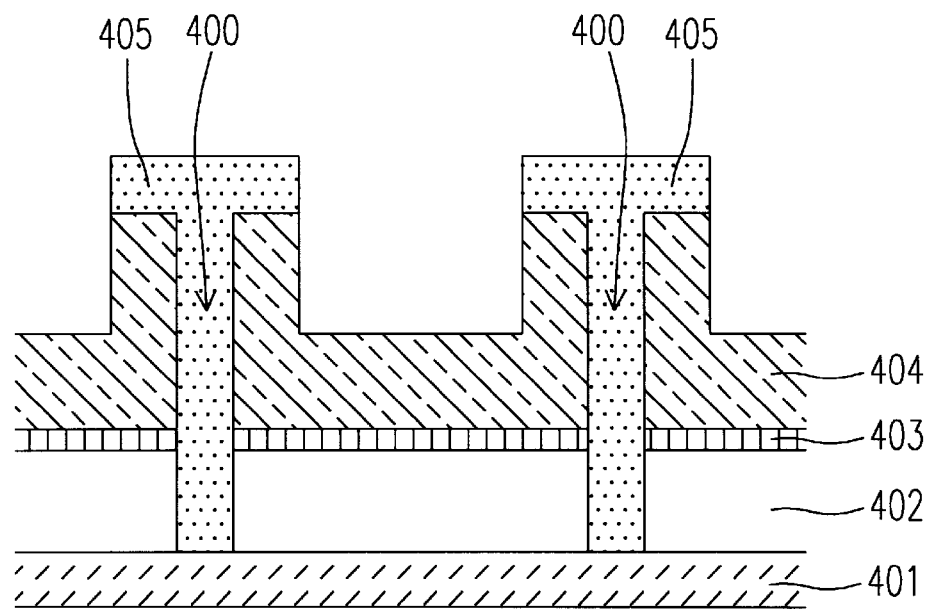

In FIG. 4(d), the first conducting layer 405 and the sacrificial oxide 404 are partially removed by photolithography and an etching process to expose a portion of the sacrificial oxide 404 and retain a portion of the first conducting layer.

Figure 4E:
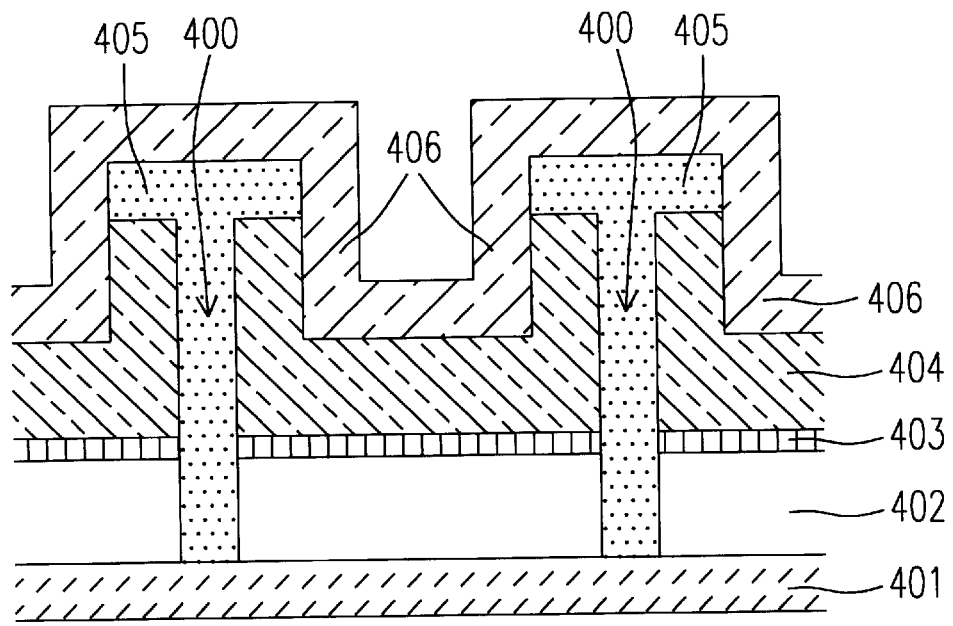

In FIG. 4(e), a second conducting layer 406 is formed over top surfaces and sidewalls of the portion of the first conducting layer 405, and the portion of the sacrificial oxide 404 by chemical vapor deposition. The second conducting layer 406 is preferably a doped polysilicon layer and has a thickness ranged between 1000 Å and 3000 Å.

Figure 4F:
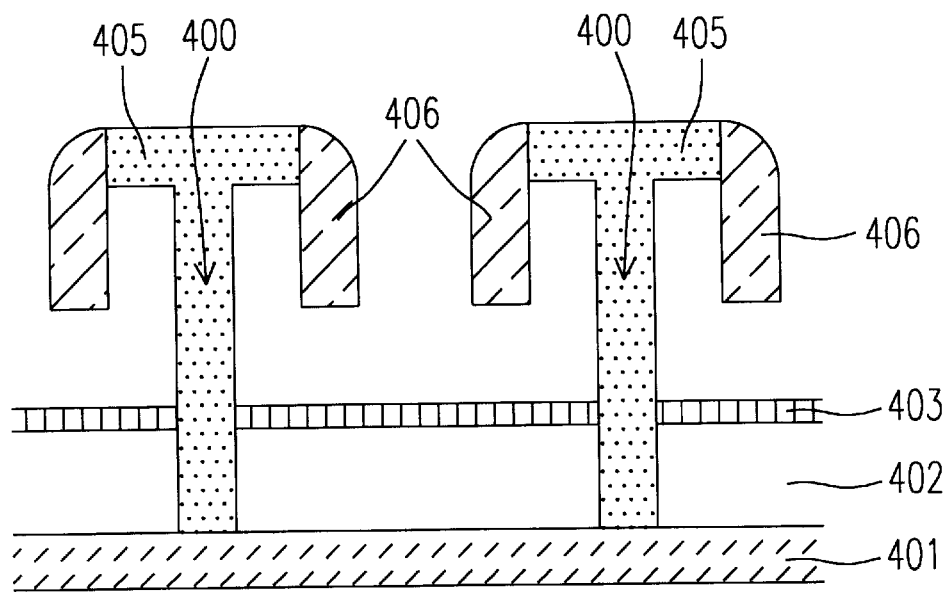

Thereafter, the second conducting layer 406 is partially removed by an anisotropic etching, such as a dry etching, while retaining a portion of the second conducting layer 406 alongside the portion of the first conducting layer 405 and the portion of the sacrificial oxide 404. Then, the sacrificial oxide 404 is completely removed by a wet etching to expose the etching stop layer 403 as shown in FIG. 4(f). The wet etching can use a buffer over etching (B.O.E.) solution containing hydrofluoric acid (HF).

Figure 4G:
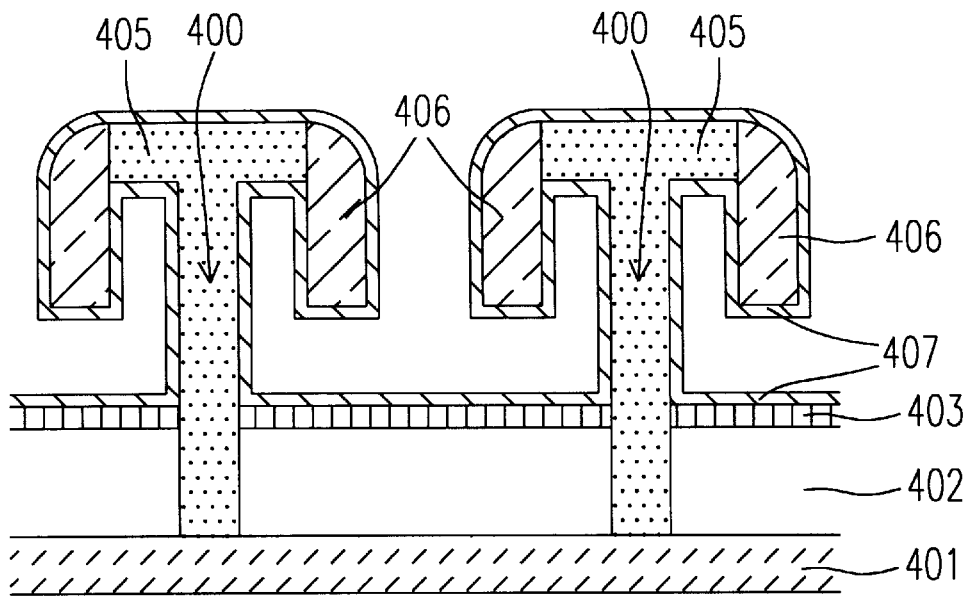

As shown in FIG. 4(g), there is a third conducting layer 407 formed over surfaces of the portion of the first conducting layer 405, the portion of the second conducting layer 406, and the etching stop layer 403.

Figure 4H:
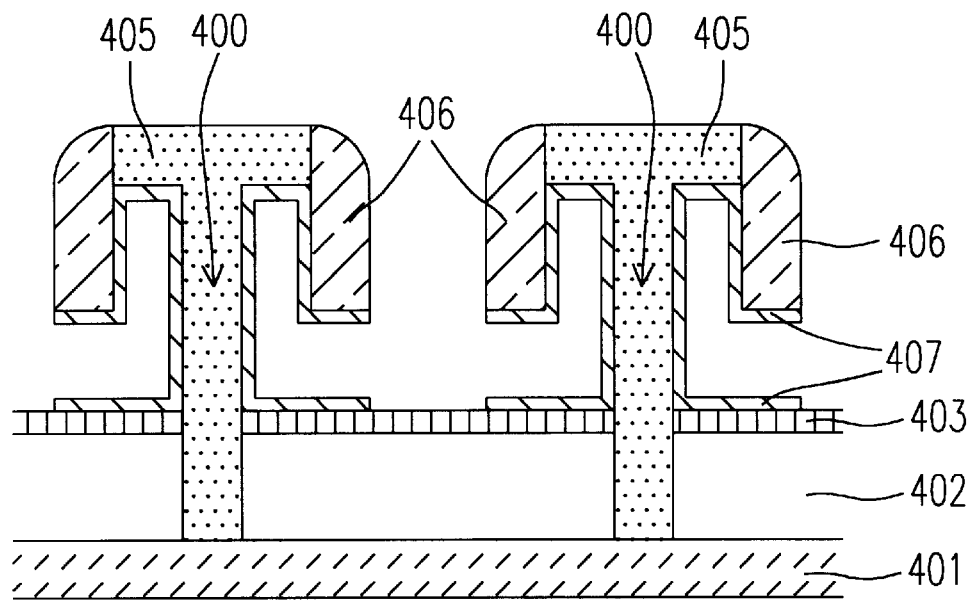

Finally, the third conducting layer 407 is partially removed while retaining a portion of the third conducting layer 407 under the portions of the first and second conducting layers 405, 406 and on the etching stop layer 403 as shown in FIG. 4(h), wherein the portions of the first, second, and third conducting layers 405, 406, 407 serve as the first capacitor plate (i.e. a lower capacitor plate).

Figure 4I:
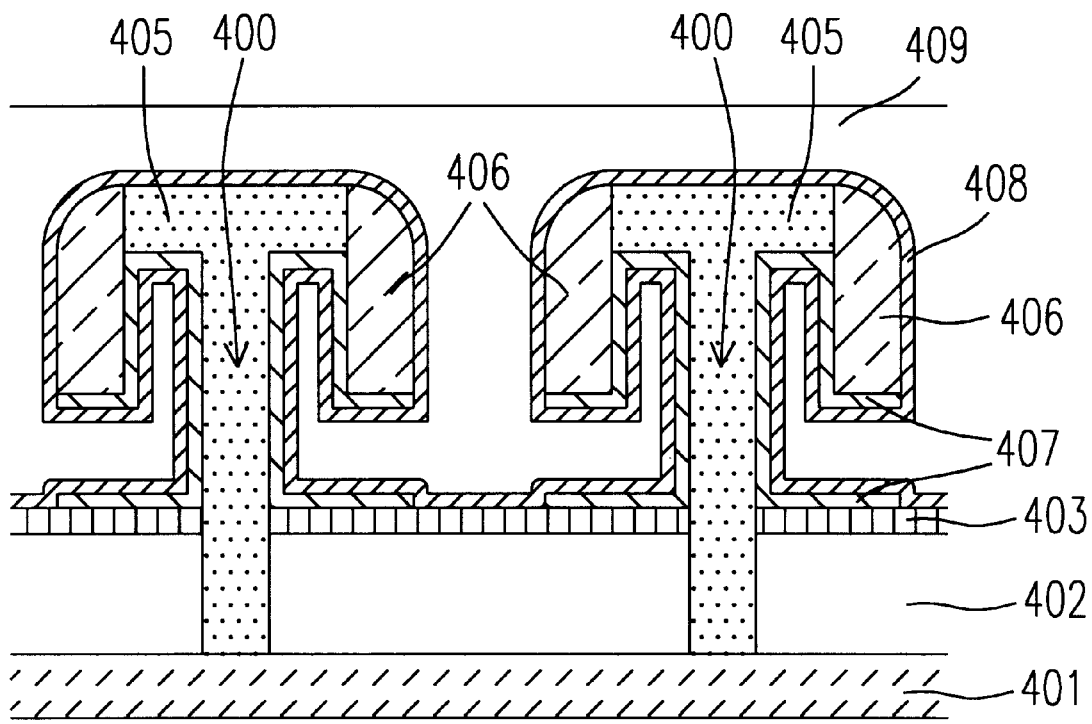

Certainly, the manufacturing method further includes other steps to obtain a complete capacitor after performing the preceding steps. As shown in FIG. 4(i), the steps further include: 1) forming another dielectric layer 408 over surfaces of the portions of the first, second, and third conducting layers 405, 406, 407 and the exposed etching stop layer 403; and 2) forming a fourth conducting layer 409 over the dielectric layer 408 to serve as an capacitor plate. The another dielectric layer 408 and the fourth conducting layer 409 are formed by a low pressure chemical vapor deposition (LPCVD). The dielectric layer 408 is preferably an oxide-on-nitride-on-oxide (ONO) layer with a thickness ranged between 50 Å and 200 Å. Preferably, the fourth conducting layer 409 is a doped polysilicon layer. The dielectric layer 408 and the fourth conducting layer 409 serve as the second capacitor plate (or an upper capacitor plate). Finally, the preferred embodiment of the capacitor according to the present invention is fabricated.

According to the present invention, the method for manufacturing the capacitor is not only very simple but can effectively increase the surface area of the capacitor. More particularly, this method will construct a special capacitor structure. As shown in FIG. 4(i), an interlayer dielectric 402 and an etching stop layer 403, both of which are formed on a silicon substrate 401 in sequence, are partially removed for forming a contact window 400. There is a conducting layer (including the first conducting layer 405 and the second conducting layer 406) filling in the contact window 400 and upwardly extended to form a generally crosssectionally modified T-shaped structure having a horizontal part and a vertical part where the, horizontal part has an end thereof extended and the space between the horizontal part and the etching stop layer are adapted to be occupied by a dielectric layer and a conducting layer.

To sum up, a generally crosssectionally modified T-shaped structure, formed by the first and second conducting layers 405 and 406 according to the present invention, not only increases the surface area but has a smooth top surface which will be conducive to the subsequent planarization process. Therefore, merely with a simple process, it can significantly increase the surface area of the capacitor in comparison with the preceding conventional capacitors. Certainly, the height of the sacrificial oxide and the etching depth can be optionally adjusted according to the desired capacity. Therefore, the method of the present invention provides a unique capacitor structure which can prevent the defects caused by the prior art and solve the problem of the insufficient capacity in the certain capacitor region.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a capacitor applied to a memory unit including a substrate forming thereon a dielectric layer, comprising steps of:
   (a) forming a sacrificial layer over said dielectric layer;
   (b) partially removing said sacrificial layer and said dielectric layer to form a contact window;
   (c) forming a first conducting layer over said sacrificial layer and in said contact window;
   (d) partially removing said first conducting layer and said sacrificial layer to expose a portion of said sacrificial layer and retain a T-shaped portion of said first conducting layer;
   (e) forming a second conducting layer over said T-shaped portion of said first conducting layer and said portion of said sacrificial layer;
   (f) executing an anisotropic etching process to partially remove said second conducting layer while retaining a portion of said second conducting layer alongside said portion of said first conducting layer and said portion of said sacrificial layer, said portion of said second conducting layer extending towards said dielectric layer;
   (g) removing said portion of said sacrificial layer to expose said dielectric layer;
   (h) forming a third conducting layer over surfaces of said portion of said first conducting layer, said second conducting layer, and said dielectric layer; and
   (i) partially removing said third conducting layer while retaining a portion of said third conducting layer under said portion of said first conducting layer and said second conducting layer and on said dielectric layer, wherein said portion of said first conducting layer, said second conducting layer, and said portion of said third conducting layer serve as a capacitor plate.

2. A method according to claim 1 wherein said dielectric layer is formed by a chemical vapor deposition (CVD).

3. A method according to claim 1 wherein said dielectric layer is a nondoped silicon glass (NSG) layer with a thickness ranged between 1000 Å and 3000 Å.

4. A method according to claim 1 wherein in said step (a), said sacrificial layer is formed by a chemical vapor deposition.

5. A method according to claim 1 wherein said sacrificial layer is a silicon dioxide layer with a thickness more than 6000 Å.

6. A method according to claim 1 wherein in said step (b), said contact window is formed by a photolithography and an etching technique.

7. A method according to claim 1 wherein in said step (c), said first conducting layer is formed by a chemical vapor deposition.

8. A method according to claim 1 wherein said first conducting layer is a doped polysilicon layer with a thickness ranged between 1000 Å and 3000 Å.

9. A method according to claim 1 wherein in said step (d), said first conducting layer and said sacrificial layer are partially removed by a photolithography and an etching technique.

10. A method according to claim 1 wherein in said step (e), said second conducting layer is formed by a chemical vapor deposition.

11. A method according to claim 1 wherein said second conducting layer is a doped polysilicon layer with a thickness ranged between 1000 Å and 3000 Å.

12. A method according to claim 1 wherein in said step (g), said portion of said sacrificial layer is removed by a wet etching using a buffer over etching (B.O.E.) solution containing hydrofluoric acid (HF).

13. A method according to claim 1 wherein in said step (h), said third conducting layer is formed by a chemical vapor deposition.

14. A method according to claim 1 wherein in said step (h), said third conducting layer is a doped polysilicon layer.

15. A method according to claim 1 further comprising steps after said step (i):

(j) forming another dielectric layer over surfaces of said portions of said first, second, and third conducting layers and said exposed dielectric layer; and (k) forming a fourth conducting layer over said another dielectric layer to serve as another capacitor plate.

16. A method according to claim 15 wherein said another dielectric layer and said fourth conducting layer are formed by a chemical vapor deposition (CVD).

17. A method according to claim 15 wherein said another dielectric layer is an oxide-on-nitride-on-oxide (ONO) layer with a thickness ranged between 50 Å and 200 Å.

18. A method according to claim 15 wherein said fourth conducting layer is a doped polysilicon layer.

19. A method according to claim 1, before said step (a), further comprising a step to form an etching stop layer on said dielectric layer to prevent said dielectric layer from being damaged.

* * * * *